US012777606B2

(12) United States Patent
Adrian et al.

(10) Patent No.: US 12,777,606 B2
(45) Date of Patent: Oct. 27, 2026

(54) COMPUTING DEVICE ASSEMBLY WITH PLURALITY OF HORIZONTAL AND VERTICAL CABLE BACKPLANES

(71) Applicant: Microsoft Technology Licensing, LLC, Redmond, WA (US)

(72) Inventors: Jason David Adrian, Woodinville, WA (US); Laurent Andrew Regimbal, Georgetown, TX (US); David William Mayer, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 93 days.

(21) Appl. No.: 18/612,962

(22) Filed: Mar. 21, 2024

(65) Prior Publication Data

US 2025/0203806 A1 Jun. 19, 2025

Related U.S. Application Data

(60) Provisional application No. 63/609,786, filed on Dec. 13, 2023.

(51) Int. Cl.
*H05K 7/14* (2006.01)

(52) U.S. Cl.
CPC ......... *H05K 7/1491* (2013.01); *H05K 7/1492* (2013.01)

(58) Field of Classification Search
CPC .. H05K 7/1491; H05K 7/1492; H05K 7/1494; H05K 7/1489; H05K 7/1488;
(Continued)

(56) References Cited

U.S. PATENT DOCUMENTS 7,599,183 B2 * 10/2009 Dittus ................ H05K 7/20727 361/728
8,773,861 B2 * 7/2014 Ross .................... H05K 7/1487 361/725

(Continued)

FOREIGN PATENT DOCUMENTS

EP 3785450 B1 5/2023

OTHER PUBLICATIONS

International Search Report and Written Opinion received for PCT Application No. PCT/US2024/055299, Feb. 24, 2025, 13 pages.

(Continued)

*Primary Examiner* — Imani N Hayman
*Assistant Examiner* — Hung Q Dang
(74) *Attorney, Agent, or Firm* — Alleman Hall LLP

(57) ABSTRACT

A computing device assembly is provided, including a rack, and a plurality of compute units that are horizontally oriented and mounted within the rack in one of two vertical stacks. The computing device assembly further includes a plurality of switches that are vertically oriented and mounted along a front side of the rack laterally between the two vertical stacks of compute units. The computing device assembly further includes a plurality of horizontal cable backplanes mounted in a vertical stack along a rear side of the rack. The computing device assembly further includes a plurality of vertical cable shuffles mounted between the two vertical stacks of compute units and between the vertically oriented switches and the vertical stack of horizontal cable backplanes.

20 Claims, 8 Drawing Sheets

(58) Field of Classification Search
CPC .... H05K 7/1487; H05K 7/1485; G06F 1/189; G06F 1/18
See application file for complete search history.

(56) References Cited

U.S. PATENT DOCUMENTS

| | | | | |
|---|---|---|---|---|
| 9,451,729 | B2 | 9/2016 | Bailey | |
| 9,603,289 | B1 | 3/2017 | Shearman | |
| 10,484,763 | B1 * | 11/2019 | Leigh | H04Q 11/0062 |
| 10,880,622 | B2 * | 12/2020 | Diaz | H05K 7/20572 |
| 12,155,979 | B2 * | 11/2024 | Levy | H04Q 1/068 |
| 2015/0139223 | A1 | 5/2015 | Mayenburg | |

OTHER PUBLICATIONS

International Preliminary Report on Patentability (Chapter I) received for PCT Application No. PCT/US2024/055299 mailed on Jun. 25, 2026, 08 pages.

* cited by examiner

COMPUTING DEVICE ASSEMBLY WITH PLURALITY OF HORIZONTAL AND VERTICAL CABLE BACKPLANES

CROSS REFERENCE TO RELATED APPLICATIONS

This application claims priority to U.S. Provisional Patent Application Ser. No. 63/609,786, filed Dec. 13, 2023, the entirety of which is hereby incorporated herein by reference for all purposes.

BACKGROUND

Modern computing increasingly takes place in data center environments. Particularly with the rise of large machine learning (ML) models, the need for increased compute power has risen dramatically. The cost of deploying and operating compute units used to handle computing tasks such as model training and inference is significant. Further, the compute time required to train large ML models can be lengthy and costly. As a result, technical challenges exist to improve data center hardware, to increase performance and control costs, for the increasing compute demands of the modern ML era.

SUMMARY

To address the above issues, a computing device assembly is provided. According to a first aspect, a computing device assembly is provided, including a rack, and a plurality of compute units that are horizontally oriented and mounted within the rack in one of two vertical stacks. The computing device assembly further includes a plurality of switches that are vertically oriented and mounted along a front side of the rack laterally between the two vertical stacks of compute units. The computing device assembly further includes a plurality of horizontal cable backplanes mounted in a vertical stack along a rear side of the rack. The computing device assembly further includes a plurality of vertical cable shuffles mounted between the two vertical stacks of compute units and between the vertically oriented switches and the vertical stack of horizontal cable backplanes.

According to a second aspect, the computing device assembly includes a rack defining a rectangular volume, a plurality of compute units, each computing unit being horizontally oriented and mounted within the rack in one of two vertical stacks positioned on opposite lateral sides of the rack. The computing device assembly further includes a plurality of switches, each switch being vertically oriented and mounted within the rack along a front side of the rack laterally between the two vertical stacks of compute units, in one of a plurality of groups positioned at respective vertical levels. The computing device assembly further includes a plurality of horizontal cable backplanes mounted in a vertical stack along a rear side of the rack, each horizontal cable backplane containing cables that electrically interconnect a compute unit from the first stack, a compute unit from the second stack and a switch at a corresponding vertical level. The computing device assembly further includes a plurality of vertical cable shuffles mounted within the rack so as to be between the two vertical stacks of compute units in a lateral dimension, and between the vertically oriented groups of switches and the vertical stack of horizontal cable backplanes in a depth (front-rear) dimension, each vertical cable shuffle including cables that electrically interconnect each of a plurality of connections on a corresponding switch from each of the groups of switches to corresponding connections on each of the horizontal cable backplanes.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
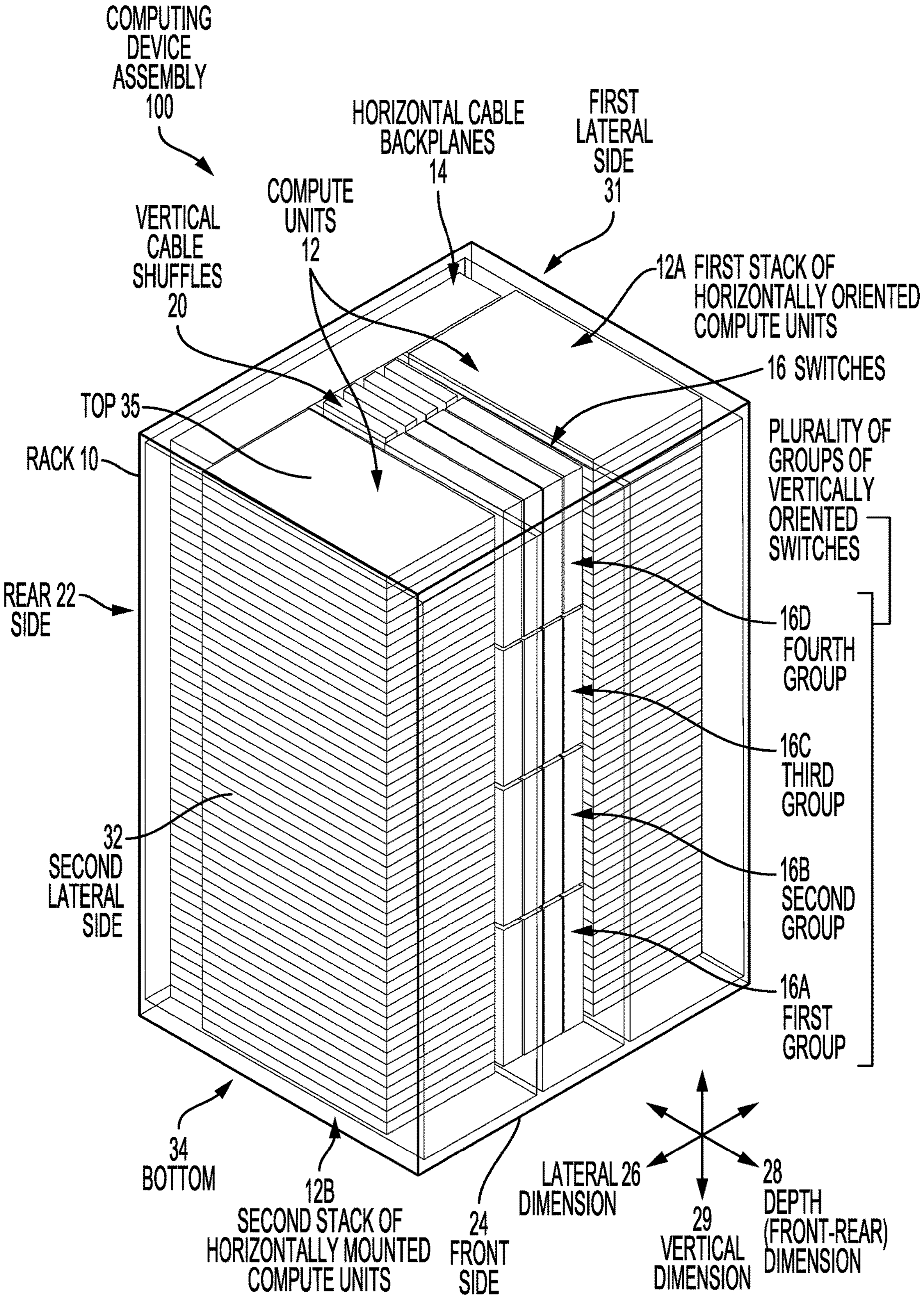
FIG. 1 is a perspective view of a computing device assembly according to an example implementation.

Turning initially to FIG. 1, a computing device assembly 100 is illustrated. The computing device assembly 100 includes a rack 10 defining a rectangular volume. The computing device assembly 100 further includes a plurality of compute units 12, each compute unit 12 being horizontally oriented and mounted within the rack 10 in one of two vertical stacks 12A, 12B positioned on opposite lateral sides 31, 32 of the rack 10. For example, the compute units 12 may be hardware accelerator units such as graphical processor units (GPUs), tensor processing units (TPUs), or field programmable gate array (FPGA) units. Alternatively, the compute units 12 may be central processing units (CPUs) of server devices. If desired, a mix of these or other types of compute units 12 may be utilized within the computing device assembly 100. The data connectors for the compute units 12 face a rear side 22 of the rack 10. The compute units 12 are mounted in a manner such that the rear faces of the compute units 12 are inset a predetermined distance from the rear of the rack 10, thus providing space for horizontal cable backplanes 14. The two vertical stacks 12A, 12B of the compute units 12 are spaced apart in a lateral dimension 26 by a gap within which other components, discussed below, are placed. The compute units 12 have a rectangular plate shape, and are elongated in the lateral dimension 26 and depth dimension 28. As viewed from above, the lateral dimension 26 of each of the compute units 12 is approximately ¼ to ⅓ of the lateral dimension 26 of the rack 10, while the depth dimension 28 of each of the compute units 12 is approximately 60-90% and in some cases 70-80% of the depth dimension 28 of the rack 10. The outer dimensions of each of the compute units 12 is typically the same.

The computing device assembly 100 further includes a plurality of switches 16, each switch 16 being vertically oriented and mounted within the rack 10 along a front side 24 of the rack 10 laterally between the two vertical stacks 12A, 12B of compute units 12, in one of a plurality of groups positioned at respective vertical levels. In the depicted embodiment, four groups 16A-16D of switches 16 are illustrated, each at a different level in a vertical dimension 29 of the rack 10. The data connections for the switches 16 are formed on the rear side of the switches 16. The switches 16 are generally the same size, each being elongated in the depth and vertical dimensions 28, 29 of the rack 10, as mounted.

The computing device assembly 100 further includes a plurality of horizontal cable backplanes 14 mounted in a vertical stack along the rear side 22 of the rack 10, each horizontal cable backplane 14 containing cables that electrically interconnect the data connections on the compute unit 12 from the first stack 12A, the compute unit 12 from the second stack 12B and the switch 16 at a corresponding vertical level. The horizontal cable backplanes 14 extend over substantially an entire lateral dimension of the rack 10, and the data connections for the horizontal cable backplanes 14 are positioned to face the front side 24 of the rack 10, thus facing the data connections on the rear side of the compute units 12.

The computing device assembly 100 further includes a plurality of vertical cable shuffles 20 mounted within the rack 10 so as to be between the two vertical stacks 12A, 12B of compute units 12 in the lateral dimension 26, and between the vertically oriented groups 16A-16D of switches 16 and the vertical stack of horizontal cable backplanes 14 in the depth dimension 28. Each of the vertical cable shuffles 20 includes cables that electrically interconnect data connections of each of a plurality of data connections on a corresponding switch from each of the groups 16A-16D of switches 16 to corresponding data connections on each of the horizontal cable backplanes 14. The vertical cable shuffles 20 typically include housings of folded sheet metal with internal cabling 48 (see FIG. 6). The vertical cable shuffles 20 are elongated in the depth and vertical dimensions 28, 29 of the rack 10, and have a minor axis in the lateral dimension 26. Data connections on the vertical cable shuffles 20 face both the rear side 22 of the rack 10 and the front side 24 of the rack 10.

Figure 2:
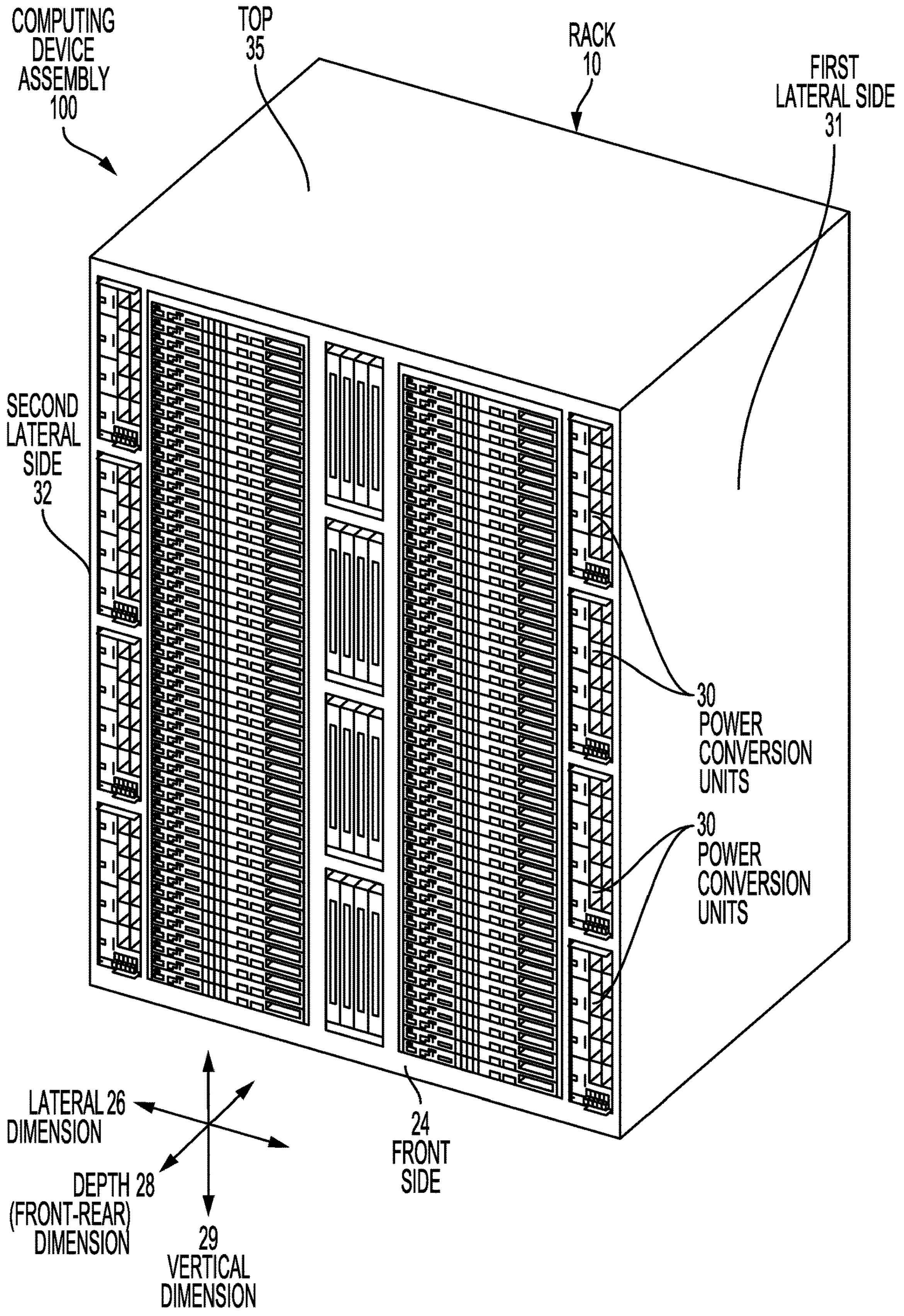
FIG. 2 is a perspective view of another example of a computing device assembly similar to FIG. 1, with power conversion units mounted in mounting bays adjacent lateral sides of the rack.

FIG. 2 is a perspective view of another example of a computing device assembly 100 similar to FIG. 1. As shown in FIG. 2, the configuration of the illustrated computing device assembly 100 includes power conversion units 30 (e.g., AC/DC converters) mounted in mounting bays adjacent lateral sides 31, 32 of the rack 10. Alternatively, the power conversion units 30 may be mounted in bays provided adjacent a bottom 34 or a top 35 of the rack 10 and a smaller number of compute units 12 may be included in the rack 10, for example.

Figure 3:
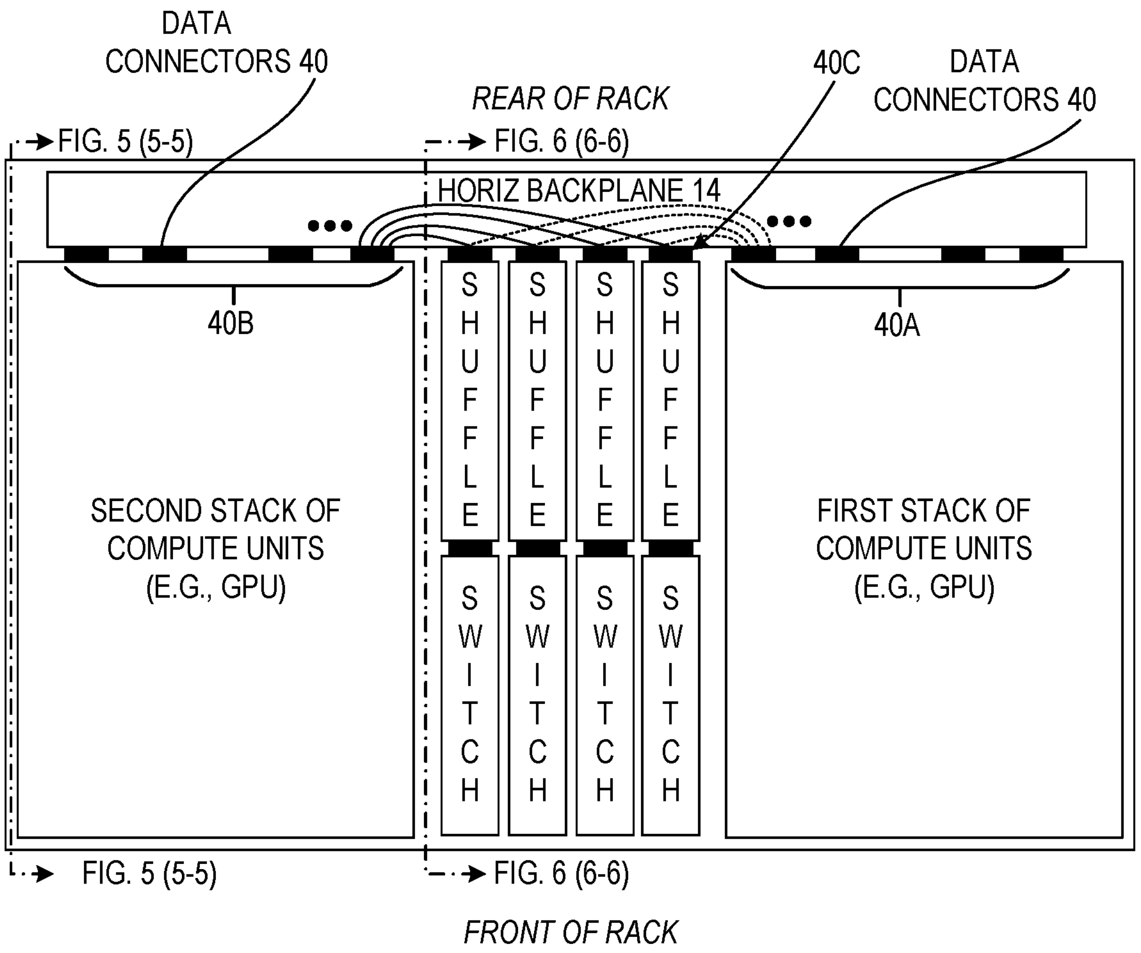
FIG. 3 is a schematic top view of an arrangement of components within the rack of FIG. 1.

FIG. 3 is a schematic top view of an arrangement of components within the rack 10 of FIG. 1. The horizontal cable backplane 14 includes a sheet metal enclosure with data connectors 40 positioned on a front facing (i.e., compute unit and vertical cable shuffle facing) side of the enclosure. The connectors 40 within the horizontal cable backplane 14 are divided into a set of first compute unit connectors 40A, a set of second compute unit connectors 40B and a set of shuffle connectors 40C. It will be appreciated that each of the connectors in the set of first compute unit connectors 40A is connected by cabling to each of the connectors in the set of shuffle connectors 40C, in a many-to-many fashion, as illustrated in dashed lines. Further, each of the connectors in the set of second compute unit connectors 40B is also connected by cabling to each of the connectors in the set of shuffle connectors 40C, in a many to many fashion, as illustrated in solid lines. The cabling in the horizontal cable backplane 14 is typically shielded copper wire, although other cabling may be used. In this view the data connections between the vertical cable shuffle 20 and switches 16 can also be seen. The number of data connections on the compute units 12, switches 16, and vertical cable shuffles 20 is exemplary, as other numbers of connections may be provided.

Figure 4:
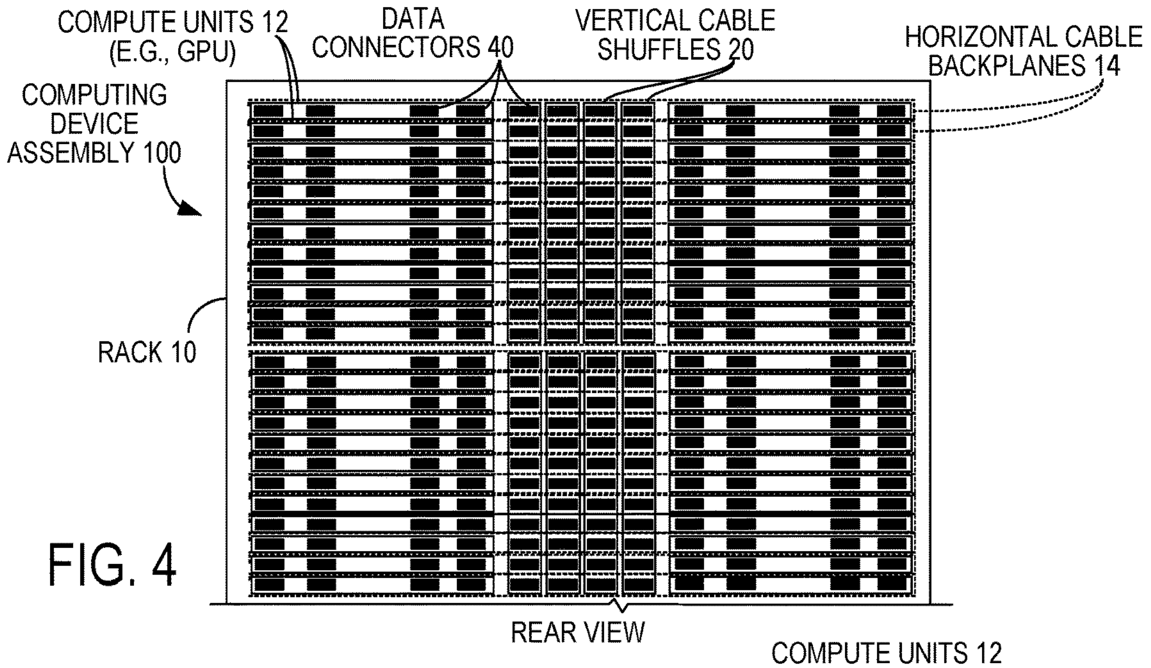
FIG. 4 is a partial schematic rear view of an arrangement of components within the rack of FIG. 1.

FIG. 4 is a partial schematic rear view of an arrangement of components within the rack 10 of FIG. 1. The horizontal cable backplane 14 is shown in dashed line in this view, enabling the connectors 40 on the compute units 12 and vertical cable shuffles 20 to be seen.

Figure 5:
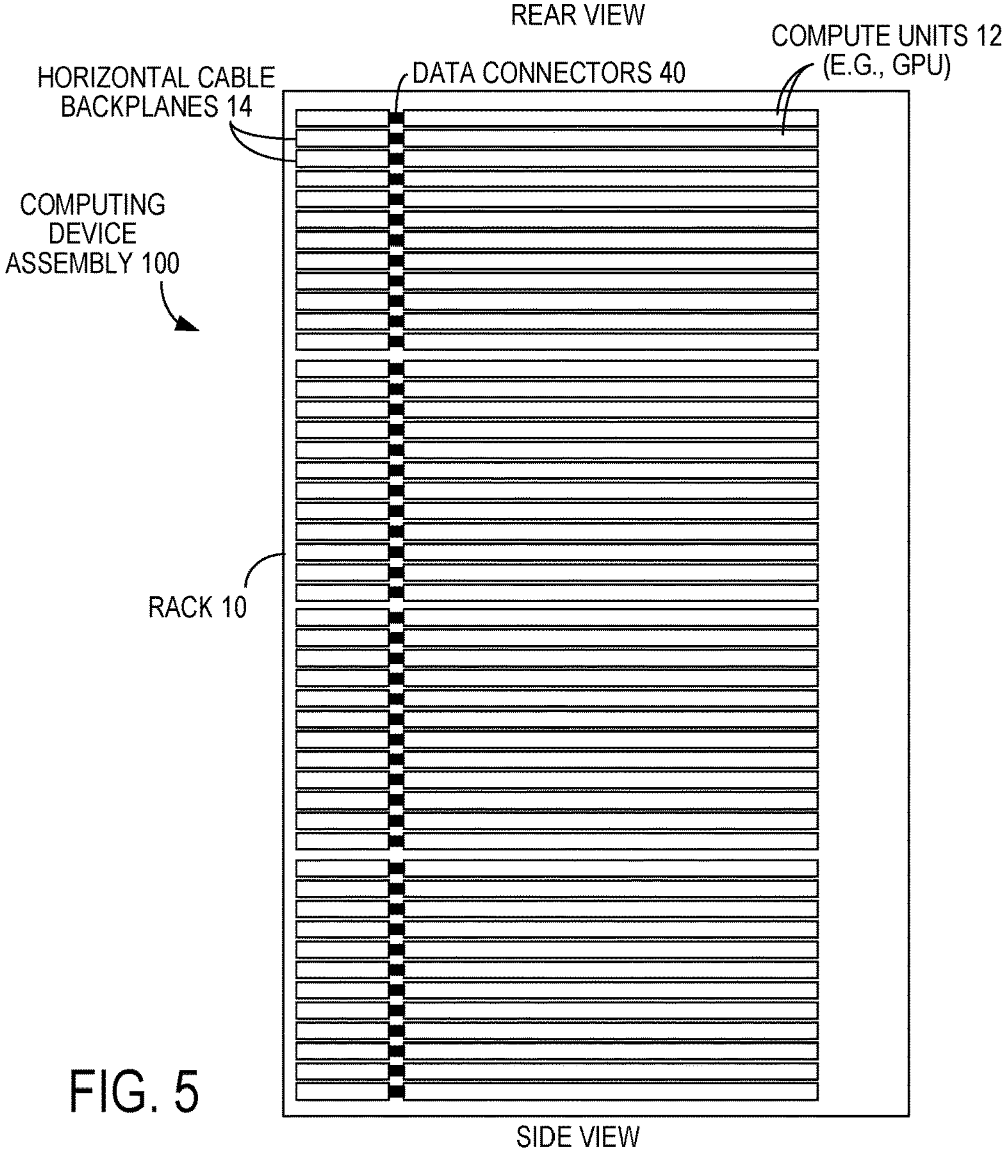
FIG. 5 is a schematic side view of an arrangement of components within the rack of FIG. 1, taken along the cross section indicated at line 5-5 in FIG. 3.

FIG. 5 is a schematic side view of the computing device assembly 100 of FIG. 1, taken along the cross section indicated at line 5-5 in FIG. 3. In this view, the side view of the horizontal cable backplane 14 is visible, as is the side view of each of the compute units 12, and the data connector 40 between these components.

Figure 6:
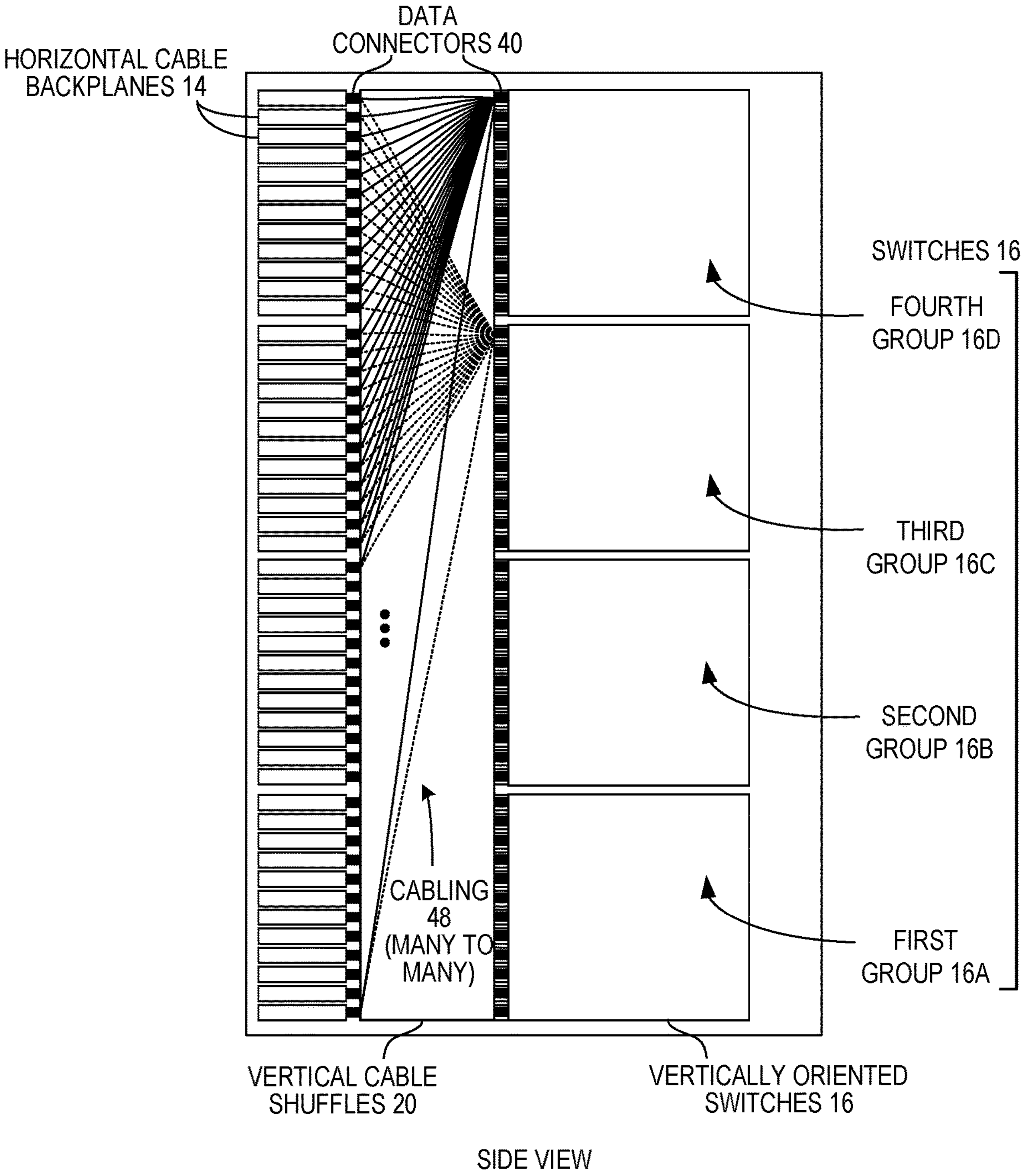
FIG. 6 is a schematic side view of an arrangement of components within the rack of FIG. 1, including internal cabling within a vertical cable shuffle, taken along the cross section indicated at line 6-6 in FIG. 3.

FIG. 6 is a schematic side view of the computing device assembly 100 of FIG. 1, illustrating the internal cabling 48 within the vertical cable shuffles 20. The view in FIG. 6 is taken along the cross section indicated at line 6-6 in FIG. 3. As shown, cabling 48, typically in the form of shielded copper wire, is provided connecting each data connector 40 on each vertically mounted switch 16 in each switch group 16A, 16B, 16C, 16D to respective data connectors 40 on each of the horizontal cable backplanes 14 to which the vertical cable shuffle 20 is connected. This results in a many-to-many cabling configuration, illustrated in solid and dashed lines for exemplary data connectors 40. By providing a vertical cable shuffle 20 with cabling 48 connecting the switches 16 to each of the respective data connectors 40 on the horizontal cable backplanes 14, the combination of the horizontal cable backplane 14 and vertical cable shuffle 20 (which acts as a vertical backplane) enables the switches 16 to route requests and responses to and from any of the compute units 12 within the rack 10 of the computing device assembly 100. This size and configuration of the horizontal and vertical backplanes 14, 20, computing units 12, and switches 16, enables data transfer rates on the order of 100 gigabit per second and higher using a passive channel.

Figure 7D:
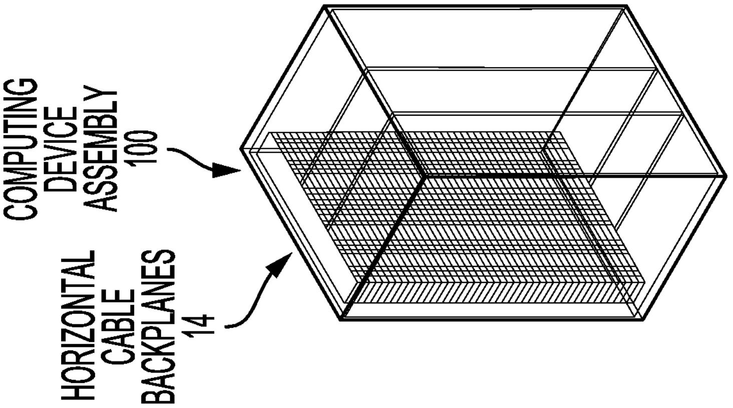
FIG. 7D shows a partially transparent perspective view of the computer device assembly of FIG. 1.
Figure 7C:
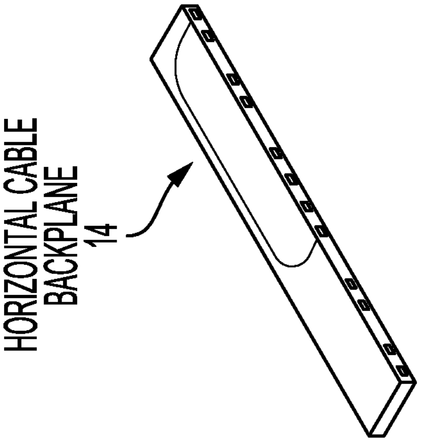
FIG. 7C shows a perspective view of the horizontal cable backplane.
Figure 7B:
FIG. 7B shows a front view of the rack.
Figure 7A:
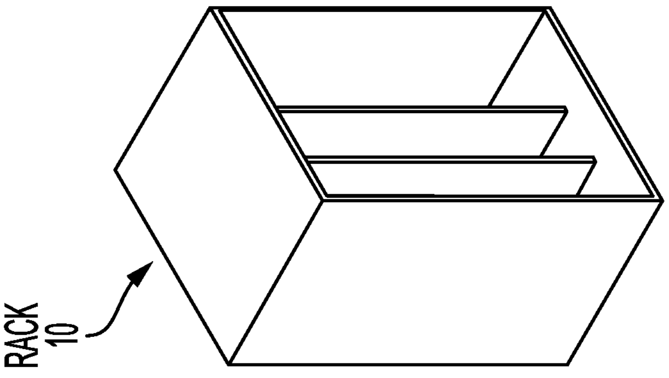
FIG. 7A shows a solid perspective view of the rack.

FIG. 7A shows a solid perspective view of the rack 10. FIG. 7B shows a front view of the rack 10. FIG. 7C shows a perspective view of the horizontal cable backplane 14. FIG. 7D shows a partially transparent perspective view of the computing device assembly 100 of FIG. 1 with only the horizontal cable backplanes 14 installed.

Figure 8A:
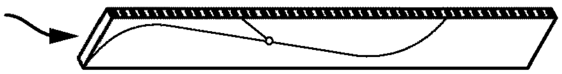
FIG. 8A shows a solid perspective view of the vertical cable shuffle with an example cable illustrated therein.
Figure 8B:
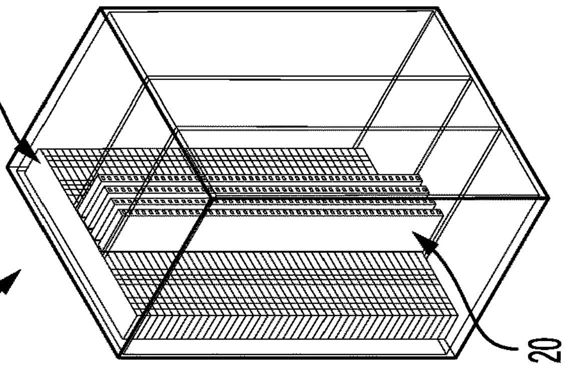
FIG. 8B shows a partially transparent perspective view of the computer device assembly of FIG. 1, with the horizontal cable backplane and vertical cable shuffle installed.
Figure 8C:
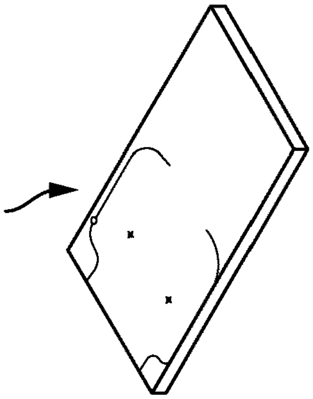
FIG. 8C shows a solid perspective view of a compute unit.
Figure 8D:
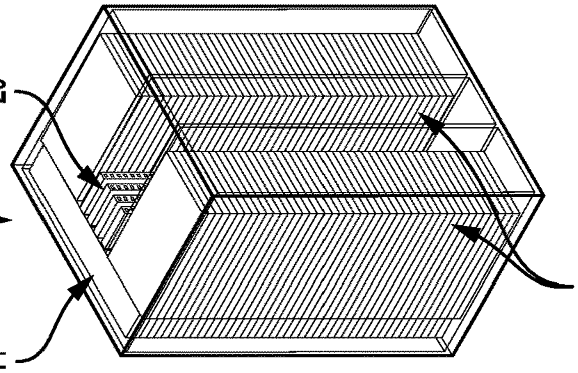
FIG. 8D shows a partially transparent perspective view of the computing device assembly of FIG. 1 with the compute units, vertical cable shuffle, and horizontal cable backplanes installed.

FIG. 8A shows a solid perspective view of the vertical cable shuffle 20 with an example cable illustrated therein. FIG. 8B shows a partially transparent perspective view of the computing device assembly 100 of FIG. 1, with the horizontal cable backplanes 14 and vertical cable shuffles 20 installed. FIG. 8C shows a solid perspective view of a compute unit 12, with two example wires illustrated therein. FIG. 8D shows a partially transparent perspective view of the computing device assembly 100 of FIG. 1 with the compute units 12, vertical cable shuffles 20, and horizontal cable backplanes 14 installed.

Figure 9A:
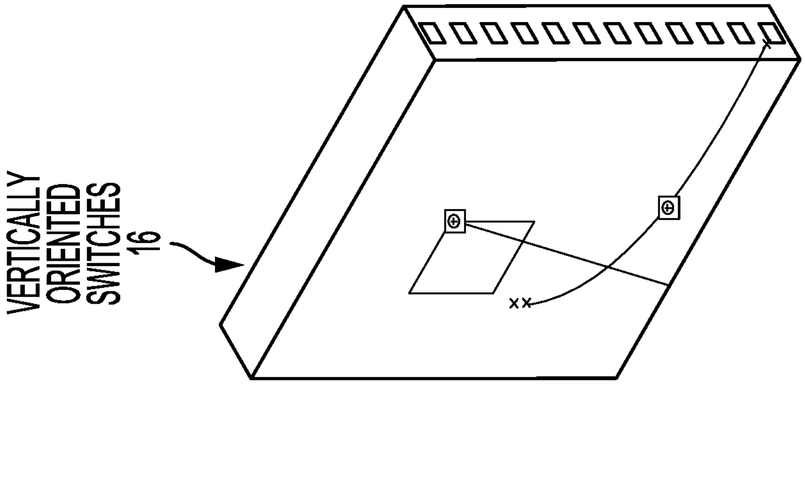
FIG. 9A shows a solid perspective view of the vertically oriented switch.
Figure 9B:
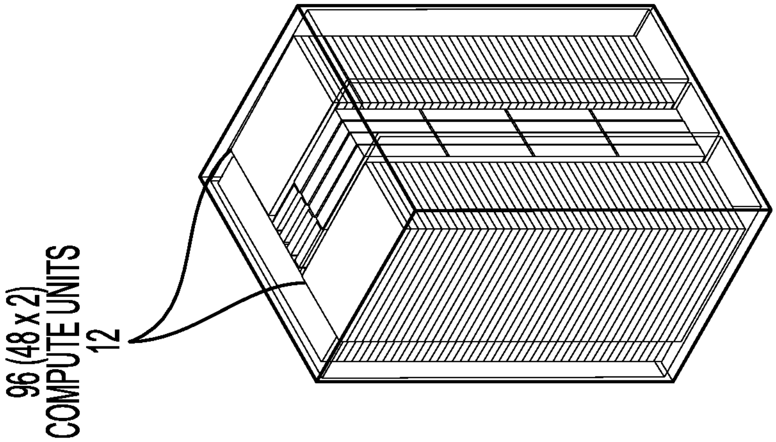
FIG. 9B shows a partially transparent perspective view of the computer device assembly of FIG. 1, with 48×2=96 compute units installed similarly to FIG. 1.
Figure 9C:
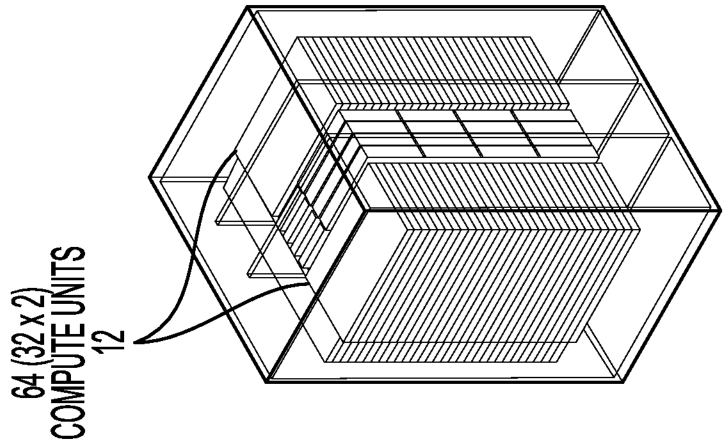
FIG. 9C shows a modified version of the configuration of FIG. 9B with 32×2=64 compute units installed.

FIG. 9A shows a solid perspective view of the vertically oriented switch 16. In FIG. 9A, the holes for the data connectors 40 are visible in the vertically oriented switch enclosure. One data connector 40 is provided for each layer on which a compute unit 12 is positioned. FIG. 9B shows a partially transparent perspective view of the computing device assembly 100 of FIG. 1, with 48×2=96 compute units 12 installed similarly to FIG. 1. FIG. 9C shows a modified version of the computing device assembly 100 of FIG. 9B with 32×2=64 compute units 12 installed. Typically, 64 or more compute units or 96 or more compute units are installed to increase the overall computing capacity of the assembled computing device assembly 100. However, it will be appreciated the other numbers of compute units 12, switches 16, and horizontal cable backplanes 14 may be provided in other configurations of the computing device assembly 100.

It is believed that the above described computing device assembly 100 provides a technical benefit when used with high data transfer rate machine learning applications, such as large ML model training and inference, at speeds on the order of 100 gigabit per second and higher using a passive channel within a rack configured in the manner of rack 10 described above, thereby improving the compute time required to train such models. Such speeds on passive channels can be reached due to the efficiency of cable routing afforded by the arrangement of components within rack 10.

The following paragraphs provide additional description of the subject matter of the present disclosure. One aspect provides a computing device assembly including a rack, a plurality of compute units, a plurality of switches, a plurality of horizontal cable backplanes, and a plurality of vertical cable shuffles. According to this aspect, the plurality of compute units may be horizontally oriented and mounted within the rack in one of two vertical stacks. The plurality of switches may be vertically oriented and mounted along a front side of the rack laterally between the two vertical stacks of compute units. The plurality of horizontal cable backplanes may be mounted in a vertical stack along a rear side of the rack. The plurality of vertical cable shuffles may be mounted between the two vertical stacks of compute units and between the vertically oriented switches and the vertical stack of horizontal cable backplanes.

According to this aspect, data connections for the horizontal cable backplanes may be positioned to face the front side of the rack, and to face data connections on a rear side of the compute units.

According to this aspect, the horizontal cable backplanes may extend over substantially an entire lateral dimension of the rack.

According to this aspect, the vertical cable shuffles may be elongated in depth and height dimensions of the rack.

According to this aspect, the vertical cable shuffles each may include a housing of folded sheet metal with internal cabling.

According to this aspect, data connections on the vertical cable shuffles may face both the rear side of the rack and the front side of the rack.

According to this aspect, a lateral dimension of each of the compute units may be approximately ¼ to ⅓ of a lateral dimension of the rack, and a depth dimension of each of the compute units may be approximately 60-90% of the rack.

According to this aspect, the depth dimension of each of the compute units may be approximately 70-80% of the rack.

According to this aspect, each of the switches may be elongated in vertical and depth dimensions of the rack.

According to this aspect, the computing device assembly may further include power conversion units mounted in mounting bays adjacent lateral sides of the rack.

According to this aspect, the plurality of compute units may include 64 compute units or more.

According to another aspect of the present disclosure, a computing device assembly is provided. According to this aspect, the computing device assembly may include a rack defining a rectangular volume. The computing device assembly may further include a plurality of compute units, in which each computing unit may be horizontally oriented and mounted within the rack in one of two vertical stacks positioned on opposite lateral sides of the rack. The computing device assembly may further include a plurality of switches, in which each switch may be vertically oriented and mounted within the rack along a front side of the rack laterally between the two vertical stacks of compute units, in one of a plurality of groups positioned at respective vertical levels. The computing device assembly may further include a plurality of horizontal cable backplanes mounted in a vertical stack along a rear side of the rack, in which each horizontal cable backplane contains cables that electrically interconnect a compute unit from a first stack of the two vertical stacks, a compute unit from a second stack of the two vertical stacks, and a switch at a corresponding vertical level. The computing device assembly may further include a plurality of vertical cable shuffles mounted within the rack so as to be between the two vertical stacks of compute units in a lateral dimension, and between the vertically oriented groups of switches and the vertical stack of horizontal cable backplanes in a depth dimension. Each vertical cable shuffle may include cables that electrically interconnect each of a plurality of connections on a corresponding switch from each of the groups of switches to corresponding connections on each of the horizontal cable backplanes.

According to this aspect, the vertical cable shuffles may be elongated in depth and height dimensions of the rack.

According to this aspect, data connections on the vertical cable shuffles may face both the rear side of the rack and the front side of the rack.

According to this aspect, a lateral dimension of each of the compute units may be approximately ¼ to ⅓ of a lateral dimension of the rack, and a depth dimension of each of the compute units may be approximately 60-90% of the rack.

According to this aspect, the depth dimension of each of the compute units may be approximately 70-80% of the rack.

According to this aspect, each of the switches may be elongated in vertical and depth dimensions of the rack.

According to this aspect, the computing device assembly may further include power conversion units mounted in mounting bays adjacent lateral sides of the rack.

According to this aspect, the vertical cable shuffles each may include a housing of folded sheet metal with internal cabling.

According to this aspect, the plurality of compute units may include 64 compute units or more.

"And/or" as used herein is defined as the inclusive or $\vee$, as specified by the following truth table:

| A | B | A $\vee$ B |
|---|---|---|
| True | True | True |
| True | False | True |
| False | True | True |
| False | False | False |

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device assembly, comprising:

a rack;

a plurality of compute units that are horizontally oriented and mounted within the rack in one of two vertical stacks;

a plurality of switches that are vertically oriented and mounted along a front side of the rack laterally between the two vertical stacks of compute units;

a plurality of horizontal cable backplanes mounted in a vertical stack along a rear side of the rack; and a plurality of vertical cable shuffles mounted between the two vertical stacks of compute units and between the vertically oriented switches and the vertical stack of horizontal cable backplanes, wherein the plurality of vertical cable shuffles are centrally positioned within the rack and are bounded on two sides in a lateral dimension by the two vertical stacks of compute units and bounded on two sides in a depth dimension by the plurality of switches and the plurality of horizontal cable backplanes.

2. The computing device assembly of claim 1, wherein data connections for the horizontal cable backplanes are positioned to face the front side of the rack, and to face data connections on a rear side of the compute units.

3. The computing device assembly of claim 1, wherein the horizontal cable backplanes extend over substantially an entire lateral dimension of the rack.

4. The computing device assembly of claim 1, wherein the vertical cable shuffles are elongated in depth and height dimensions of the rack.

5. The computing device assembly of claim 1, wherein the vertical cable shuffles each include a housing of folded sheet metal with internal cabling.

6. The computing device assembly of claim 1, wherein data connections on the vertical cable shuffles face both the rear side of the rack and the front side of the rack.

7. The computing device assembly of claim 1, wherein a lateral dimension of each of the compute units is approximately ¼ to ⅓ of a lateral dimension of the rack, and a depth dimension of each of the compute units is approximately 60-90% of the rack.

8. The computing device assembly of claim 7, wherein the depth dimension of each of the compute units is approximately 70-80% of the rack.

9. The computing device assembly of claim 1, wherein each of the switches is elongated in vertical and depth dimensions of the rack.

10. The computing device assembly of claim 1, further comprising:

power conversion units mounted in mounting bays adjacent lateral sides of the rack.

11. The computing device assembly of claim 1, wherein the plurality of compute units includes 64 compute units or more.

12. A computing device assembly, comprising:

a rack defining a rectangular volume;

a plurality of compute units, each computing unit being horizontally oriented and mounted within the rack in one of two vertical stacks positioned on opposite lateral sides of the rack;

a plurality of switches, each switch being vertically oriented and mounted within the rack along a front side of the rack laterally between the two vertical stacks of compute units, in one of a plurality of groups positioned at respective vertical levels;

a plurality of horizontal cable backplanes mounted in a vertical stack along a rear side of the rack, each horizontal cable backplane containing cables that electrically interconnect a compute unit from a first stack of the two vertical stacks, a compute unit from a second stack of the two vertical stacks, and a switch at a corresponding vertical level; and a plurality of vertical cable shuffles mounted within the rack so as to be between the two vertical stacks of compute units in a lateral dimension, and between the vertically oriented groups of switches and the vertical stack of horizontal cable backplanes in a depth dimension, each vertical cable shuffle including cables that electrically interconnect each of a plurality of connections on a corresponding switch from each of the groups of switches to corresponding connections on each of the horizontal cable backplanes, wherein the plurality of vertical cable shuffles are centrally positioned within the rack and are bounded on two sides in a lateral dimension by the two vertical stacks of compute units and bounded on two sides in a depth dimension by the plurality of switches and the plurality of horizontal cable backplanes.

13. The computing device assembly of claim 12, wherein the vertical cable shuffles are elongated in depth and height dimensions of the rack.

14. The computing device assembly of claim 12, wherein data connections on the vertical cable shuffles face both the rear side of the rack and the front side of the rack.

15. The computing device assembly of claim 12, wherein a lateral dimension of each of the compute units is approximately ¼ to ⅓ of a lateral dimension of the rack, and a depth dimension of each of the compute units is approximately 60-90% of the rack.

16. The computing device assembly of claim 15, wherein the depth dimension of each of the compute units is approximately 70-80% of the rack.

17. The computing device assembly of claim 12, wherein each of the switches is elongated in vertical and depth dimensions of the rack.

18. The computing device assembly of claim 12, further comprising:

power conversion units mounted in mounting bays adjacent lateral sides of the rack.

19. The computing device assembly of claim 12, wherein the vertical cable shuffles each includes a housing of folded sheet metal with internal cabling.

20. The computing device assembly of claim 12, wherein the plurality of compute units include 64 compute units or more.

* * * * *